(12) United States Patent
Lu et al.

(10) Patent No.: US 9,741,567 B2
(45) Date of Patent: *Aug. 22, 2017

(54) METHOD OF FORMING MULTIPLE PATTERNING SPACER STRUCTURES

(71) Applicant: Taiwan Semiconductor Manufacturing Company, Ltd., Hsin-Chu (TW)

(72) Inventors: Chih Wei Lu, Hsin-Chu (TW); Chung-Ju Lee, Hsin-Chu (TW); Shau-Lin Shue, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/202,403

(22) Filed: Jul. 5, 2016

(65) Prior Publication Data

US 2016/0314971 A1    Oct. 27, 2016

Related U.S. Application Data

(63) Continuation of application No. 14/816,946, filed on Aug. 3, 2015, now Pat. No. 9,384,994, which is a continuation of application No. 14/047,111, filed on Oct. 7, 2013, now Pat. No. 9,095,995.

(51) Int. Cl.
| | | |
|---|---|---|
| B44C 1/22 | (2006.01) | |
| C03C 15/00 | (2006.01) | |
| C03C 25/68 | (2006.01) | |
| C23F 1/00 | (2006.01) | |
| H01L 21/033 | (2006.01) | |
| H01L 21/308 | (2006.01) | |
| B29C 33/38 | (2006.01) | |
| H01L 21/311 | (2006.01) | |
| B29L 31/00 | (2006.01) | |

(52) U.S. Cl.
CPC .......... H01L 21/0338 (2013.01); B29C 33/38 (2013.01); H01L 21/0335 (2013.01); H01L 21/0337 (2013.01); H01L 21/3086 (2013.01); H01L 21/31116 (2013.01); B29L 2031/757 (2013.01)

(58) Field of Classification Search
USPC ............................................ 216/46; 438/696
See application file for complete search history.

(56) References Cited

U.S. PATENT DOCUMENTS 8,268,727 B2    9/2012 Johnson et al.

*Primary Examiner* — Roberts Culbert
(74) *Attorney, Agent, or Firm* — Slater Matsil, LLP

(57) ABSTRACT

Disclosed herein is a method of forming a structure, comprising forming a mandrel layer over a substrate, masking the mandrel layer with a first mask and performing a first etch on the mandrel layer, the first etch forming a first opening exposing a first portion of the substrate. The mandrel layer is masked with a second mask and a second etch is performed on the mandrel layer. The second etch forms a second opening exposing a second portion of the substrate, and also forms a protective layer on the first portion of the substrate and in the first opening.

20 Claims, 7 Drawing Sheets

METHOD OF FORMING MULTIPLE PATTERNING SPACER STRUCTURES

PRIORITY CLAIM

This application is a continuation of U.S. patent application Ser. No. 14/816,946, filed on Aug. 3, 2015 and entitled "Method of Forming Multiple Patterning Spacer Structures," which claims the benefit and is a continuation of U.S. patent application Ser. No. 14/047,111, filed on Oct. 7, 2013 and entitled "Method of Forming Multiple Patterning Spacer Structures" now U.S. Pat. No. 9,095,995, issued on Aug. 4, 2015, which applications are incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller components require techniques for forming smaller features that are closer together than previous technique permit.

One technique providing features for 32 nm and smaller device fabrication procedures is self-aligning spacers. A mandrel layer is patterned, and a spacer layer is grown on the mandrel layer. The spacer material on the sidewalls of the mandrel layer remains after removing the mandrel layer, and the spacers are used as a mask to pattern a lower layer.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable concepts that can be embodied in a wide variety of specific contexts. The specific embodiments discussed are merely illustrative of specific ways to make and use the disclosure, and do not limit the scope of the disclosure. Note that, for simplification, not all element numbers are included in each subsequent drawing. Rather, the element numbers most pertinent to the description of each drawing are included in each of the drawings.

An etchable mandrel layer is used to form spacers for patterning a substrate. In some embodiments, the mandrel layer is etched using two or more mask-and-etch procedures. The mandrel layer is etched and used as a support structure for forming spacers with narrow widths and small pitches, or small separation between the spacers. A polymerizing etchant for at least the second and subsequent etches reacts with the substrate exposed by the first etch to form a protective layer on the substrate. The protective layer prevents the second and subsequent etches from etching the exposed substrate, or at least reduces the etching of the substrate by the polymerizing etchant. A spacer layer is formed over the mandrel, and the horizontal surfaces of the spacer layer are removed to leave spacers on the sidewalls of the mandrel layer. The spacers are then used as a mask to etch the underlying substrate. Using the polymerizing etchant to etch the mandrel layer prior to spacers being formed results in a substantially planar substrate surface. Additionally, after etching the substrate, the horizontal surfaces of the resulting structures etched in the substrate are substantially flat, level or coplanar.

Figure 1:
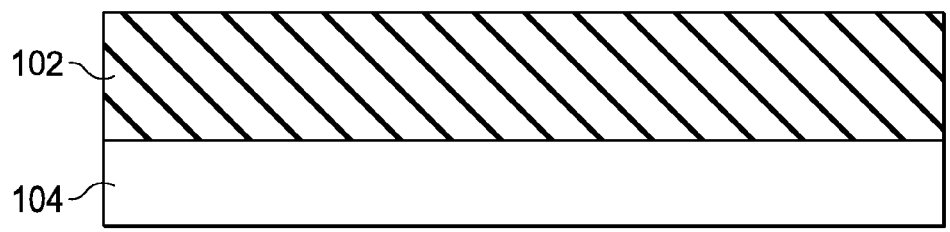
FIGS. 1-12 are cross-sectional views of intermediate steps in forming spacers and patterning a substrate layer according to an embodiment.

FIG. 1 is a cross-sectional view of a mandrel layer 102 formed over the substrate according to an embodiment of the disclosure. The mandrel layer 102 is formed on a substrate 104 and is patterned in subsequent steps to act as a structure on which spacers are formed. The substrate 104 is silicon (Si), but in other embodiments, is gallium arsenide (GaAs), silicon germanium (SiGe), indium phosphide (InP), or another suitable semiconductor material. The mandrel layer 102 is formed from silicon, silicon nitride (SiN), silicon carbide (SiC), silicon oxynitride (SiON), silicon oxide ($SiO_x$) or another material that exhibits a high etch selectivity relative to the substrate 104. For example, a SiN mandrel layer 102 is formed on a silicon substrate 104, resulting in a high (>10) etch selectivity for the SiN over the silicon.

The mandrel layer 102 is formed by a chemical vapor deposition (CVD), plasma enhanced CVD (PECVD), a spin-on technique, epitaxy, or another suitable layer deposition technique. Additionally, in an embodiment, the mandrel layer 102 is surfaced by polishing, by a chemical-mechanical polish (CMP), by cleaning, a combination of the foregoing, or by another suitable surface processing technique.

Figure 2:
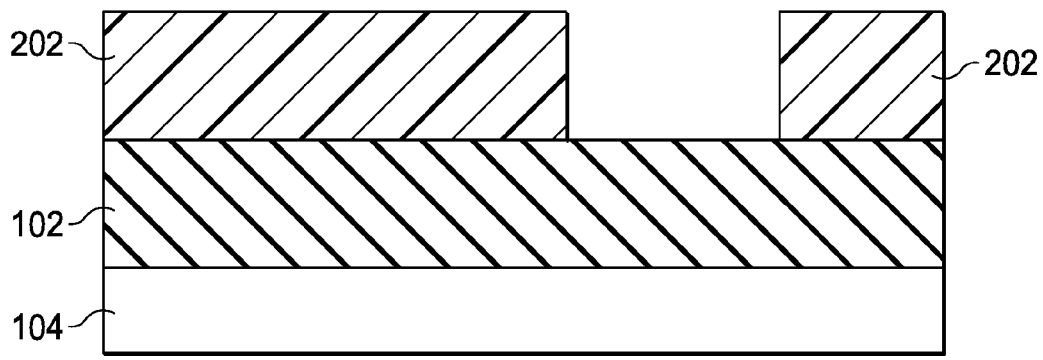

FIG. 2 is a cross-sectional view illustrating formation of a first mask 202 over the mandrel layer 102 according to an embodiment. The first mask 202 is a photoresist patterned to form a first opening in the mandrel layer 102. In another embodiment, the first mask 202 is a hard mask such as SiC, an oxide such as silicon oxide, a silicon oxynitride, a metal, or another suitable mask material. The use of a CVD or hard mask material such as SiN for the mandrel layer 102 permits the use of a photoresist first mask 202 directly on the mandrel layer 102 without an intervening hard mask over the mandrel layer 102.

Figure 3:
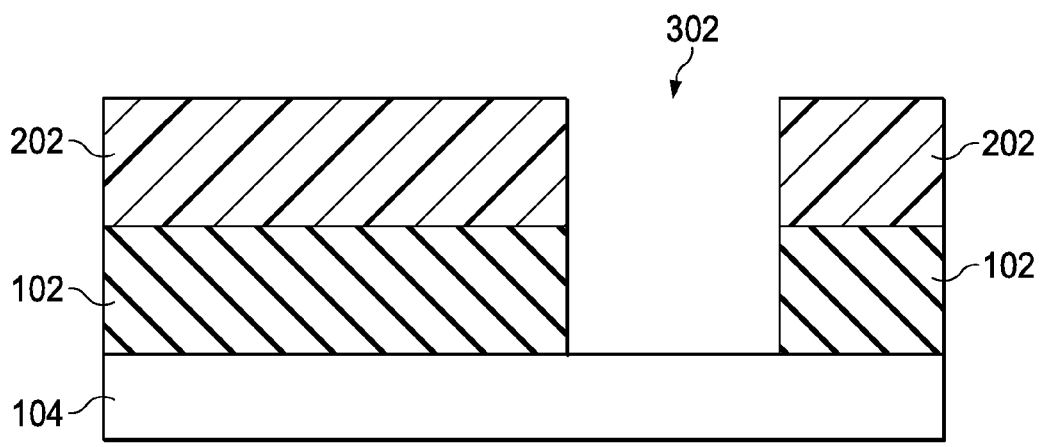

FIG. 3 is a cross-sectional view illustrating first etching of the mandrel layer 102 using the first mask 202. A first opening 302 is etched in the mandrel layer 102, and extends to the substrate 104. In an embodiment, the etching process is a dry plasma etch with a high selectivity for etching the mandrel layer 102 over the substrate 104. For example, where the mandrel layer 102 is SiN and the substrate 104 is Si, the mandrel layer may be etched with carbon tetraflouride ($CF_4$) and difluoromethane ($CH_2F_2$) in a plasma environment. Such a plasma etch tends to etch the SiN mandrel layer rapidly and then etches the Si substrate relatively slowly, resulting in a first opening 302 with little or no damage to the underlying substrate 104. In another embodiment, the mandrel layer 102 is Si and the substrate 104 is SiN, titanium nitride (TiN), silicon oxide, or the like. In such an embodiment, the mandrel layer 102 is etched with an etchant group such as hydrogen bromide (HBr) and chlorine ($Cl_2$) or HBr and oxygen. The HBr-containing etchant groups etch the Si Mandrel layer 102 rapidly with little damage to the underlying substrate 104.

Figure 4:
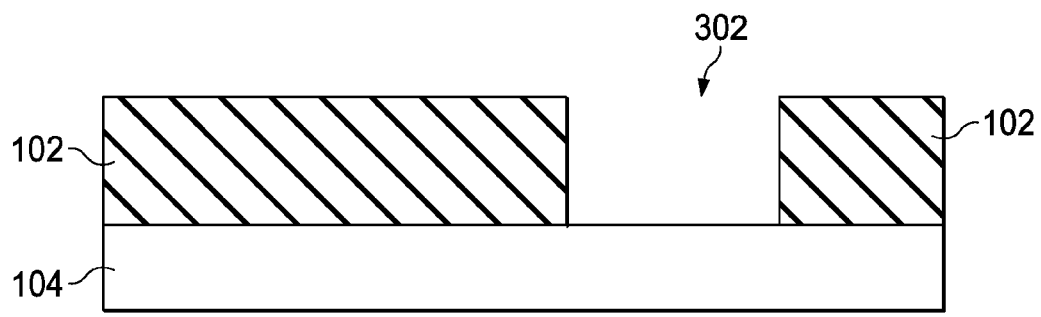
Figure 13:
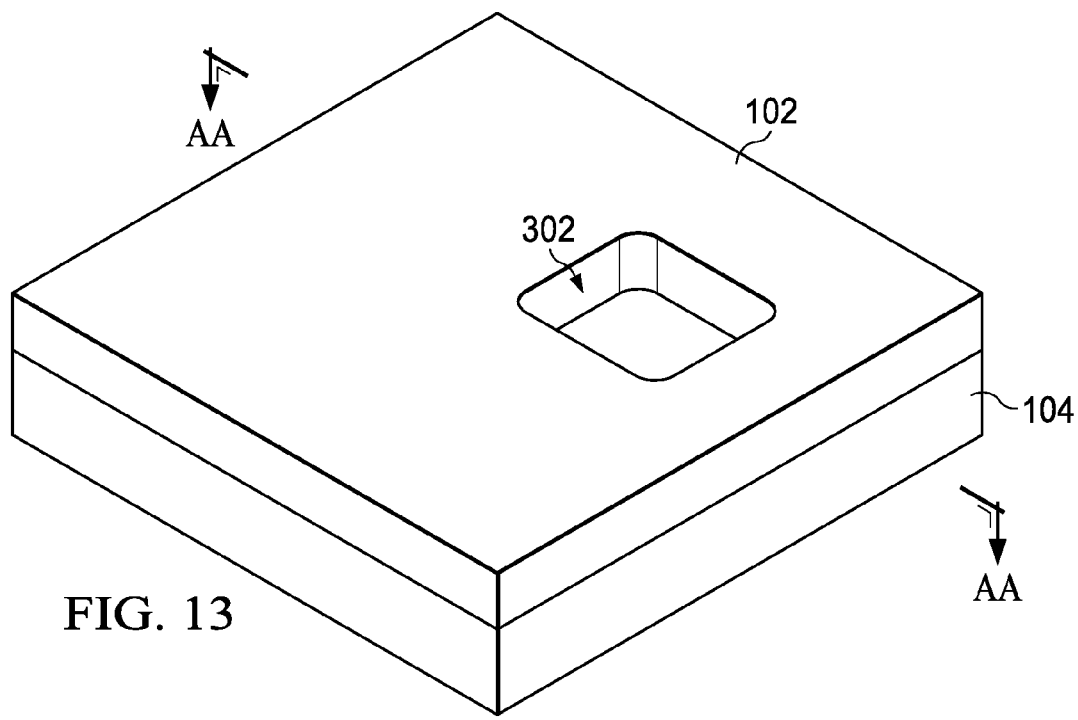
FIGS. 13-15 are perspective views of some intermediate steps in forming spacers and patterning a substrate layer according to an embodiment.

FIG. 4 is a cross-sectional view illustrating the mandrel layer 102 with the first opening 302 according to an embodiment after removing the first mask (FIG. 3, element 202). For reference, FIG. 13 is a perspective view illustrating an embodiment of the mandrel layer 102 with the first opening 302, wherein FIG. 4 is a cross-sectional view taken along plane AA-AA of FIG. 13. The first mask 202 is removed by plasma ashing, a solvent, or another mask removal technique.

Figure 5:
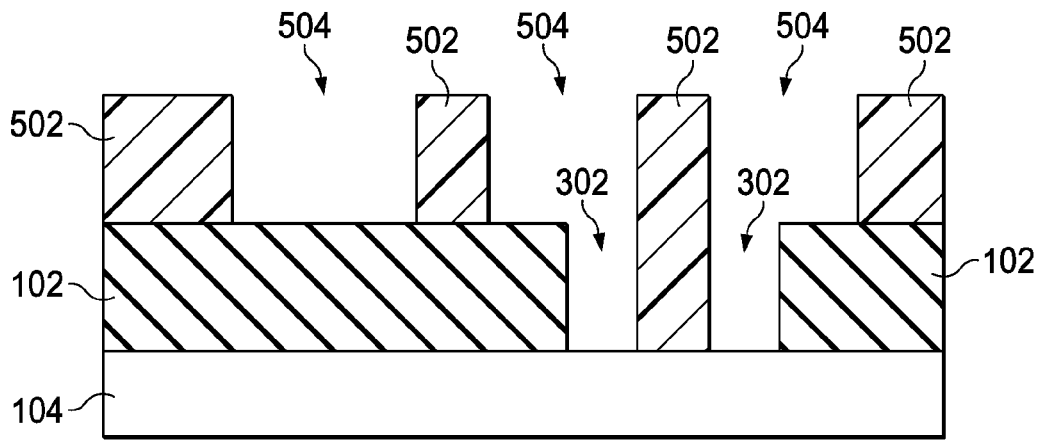
Figure 14:
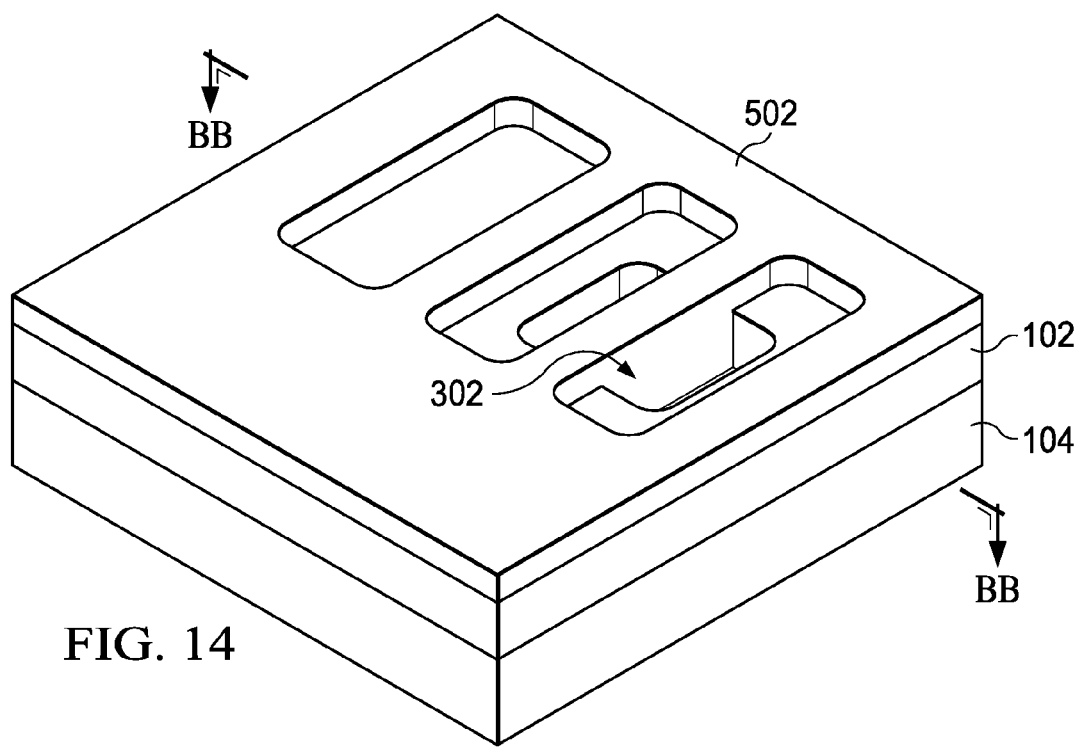

FIG. 5 is a cross-sectional view illustrating formation of a second mask 502 over the mandrel layer according to an embodiment. For reference, FIG. 14 is a perspective view illustrating an embodiment of the mandrel layer 102 with the second mask 502, wherein FIG. 5 is a cross-sectional view taken along plane BB-BB of FIG. 14. The second mask 502 is formed from a patterned and developed photoresist or another suitable mask. In another embodiment, the second mask 502 may be a hard mask or another suitable mask material. The second mask 502 exposes the substrate 104 by having at least one second opening 504 over the first opening 302. In the illustrated embodiment, the second mask 502 extends into the first opening 302, however, the second mask 502 is not limited to extending into the first opening 302, and any second mask 502 layout may be used.

Figure 6:
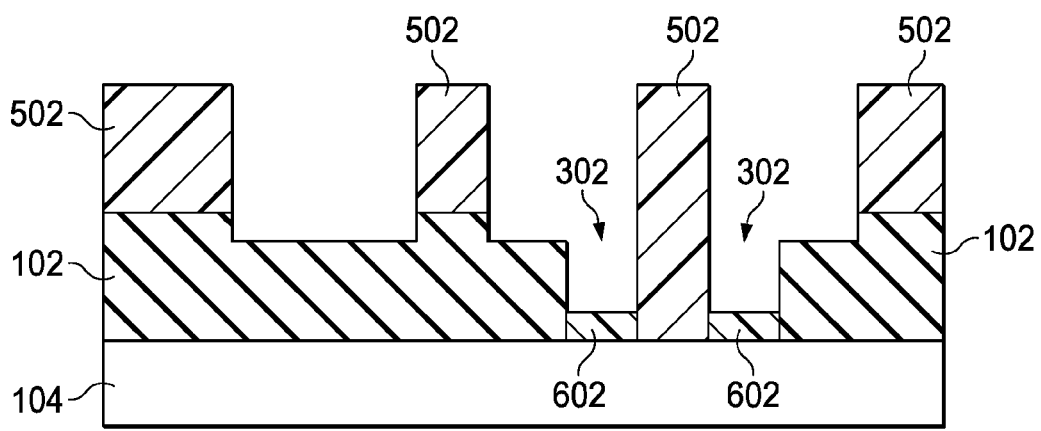

FIG. 6 is a cross-sectional view illustrating a second etching of the mandrel layer 102 according to an embodiment. In such an embodiment, the second etch is a dry etch using a polymerizing etchant. The interaction of the exposed substrate 104 and the polymerizing etchant creates a self-aligning mask, with the protective layer 602 formed in the bottom surface of the first opening 302.

The protective layer 602 prevents the etchant from etching the substrate 102, resulting in a region of the substrate 104 under the first opening 302 with little or no damage to the surface of the substrate 104. Patterning the mandrel layer 102 while avoiding double etching the substrate 104 permits uniform etching of the substrate 104 in subsequent stages, resulting in fins or other substrate features of a uniform height and with uniform depths in etched regions.

In an embodiment, the polymerizing etchant may be $CF_4$, diflouromethane ($CH_2F_2$), octaflourocyclobutane ($C_4F_8$), hexafluorobutadiene ($C_4F_6$), flouroform ($CHF_3$), or a combination of those etchants. Such polymerizing etchants react with a silicon substrate 104 to form a polymer protective layer 602. In such an embodiment, the protective layer is a polymer such as $C_xH_y$ or $C_xH_yF_z$, depending on the polymerizing etchant. The protective layer 602 may be formed with a thickness between about 1 nm and about 20 nm, and the SiN mandrel layer 102 may be etched at a rate of about 30 Angstroms/second. It should be understood that the polymerizing etchant and etching parameters may be adjusted based on the material of the mandrel layer, material of the substrate 104, etch depth or other fabrication variables.

Figure 7:
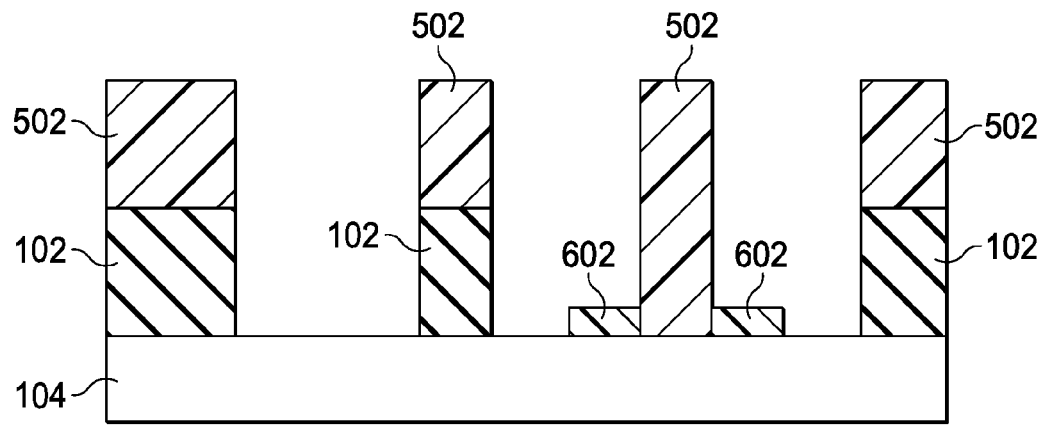

FIG. 7 is a cross-sectional view illustrating the mandrel layer 102 after the second etch. The protective layer 602 remains after the second etch because the protective layer 602 is not etched by the polymerizing etchants. Notably, the area under the protective layer 602 is not etched by the second etch. Additionally, depending on parameters of the second etch, a protective layer may form on portions of the substrate 104 exposed by the second etch.

Figure 8:
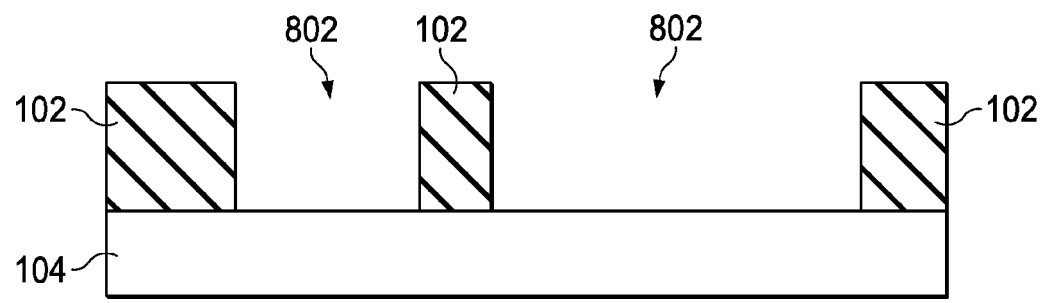
Figure 15:
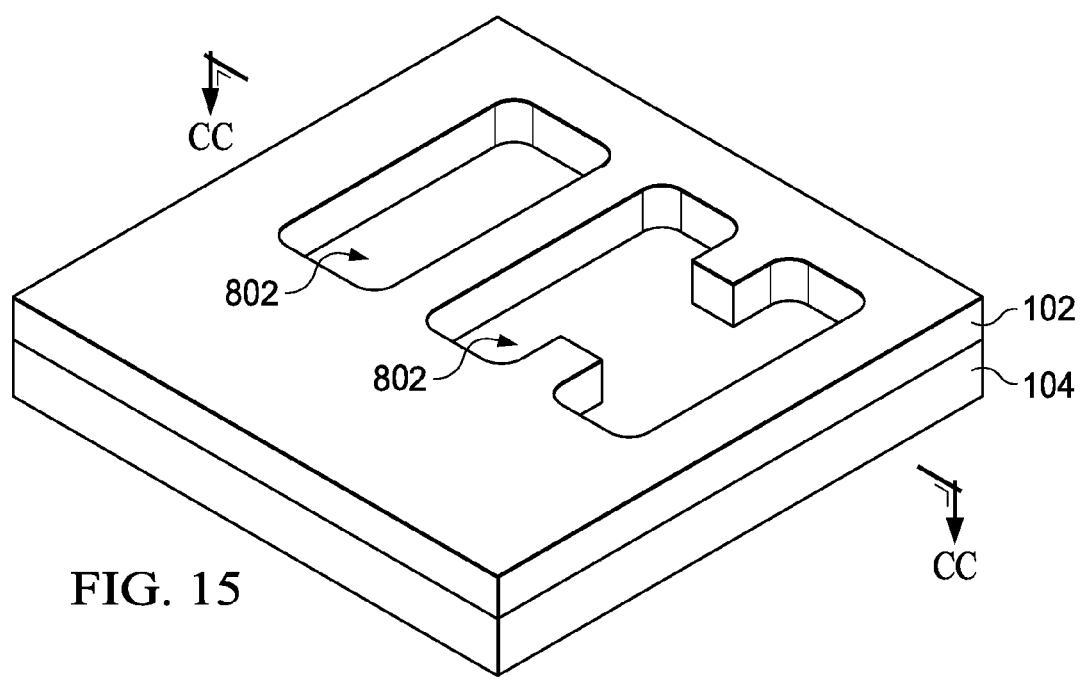

FIG. 8 is a cross-sectional view illustrating of the mandrel layer 102 after removal of the second mask 502 and protective layer 602 according to an embodiment. For reference, FIG. 15 is a perspective view illustrating an embodiment of the mandrel layer 102 after the second etch, wherein FIG. 8 is a cross-sectional view taken along plane CC-CC of FIG. 15. Second openings 802 are formed by etching over the first opening 302 (See, e.g., FIG. 3). In an embodiment, the second mask 502 and the protective layer 602 are removed, by ashing, or by another suitable mask removal process. The result of the second etch with the protective layer 602 (See, e.g., FIGS. 6-7) is openings 802 in the mandrel layer 102 formed by two separate mask-and-etch processes and having a substantially flat bottom surface, with the surfaces of the substrate under the first opening 302 and the second openings 802 substantially coplanar within the limits of process variation.

It should be understood that while a single second etch is illustrated herein, such an embodiment is merely exemplary and not intended to be limiting. The protective layer 602 (See, e.g., FIG. 6) results in a greater etch selectivity for the material of the mandrel layer 102 over the substrate 104 since the protective layer 602 prevents or significantly reduces etching of the substrate 104. One or more second etches may be performed by forming a second mask, using a polymerizing etchant, removing the second mask, and repeating the steps to etch additional features.

Figure 9:
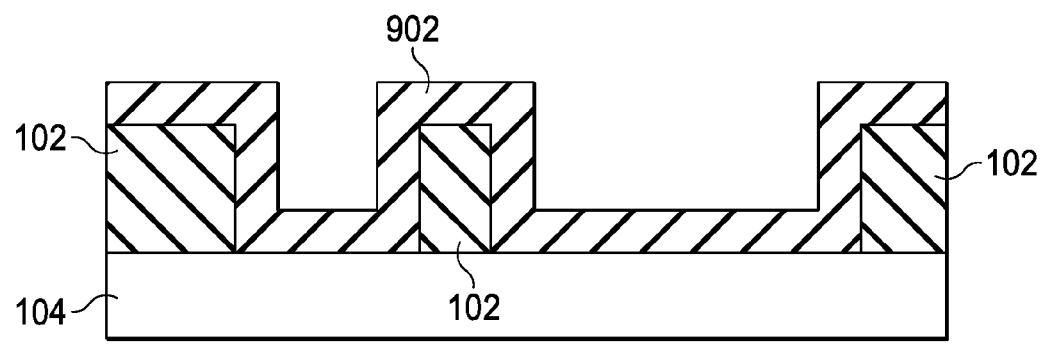

FIG. 9 is a cross-sectional view illustrating formation of a spacer layer 902 over the mandrel layer 102. In an embodiment, the spacer layer 902 is a metal or oxide layer formed over a SiN mandrel layer 102. In other embodiments, the spacer layer 902 is formed from a material that is resistant to etching compared to the mandrel layer material 102. For example, where the mandrel layer 102 is SiN the spacer layer 902 is $SiO_2$, where the mandrel layer 102 is an oxide, the spacer layer 902 is SiN, or where the mandrel layer 102 is Si, the spacer layer 902 is TiN, silicon oxide or titanium oxide ($TiO_x$).

The spacer layer 902 is formed using a conformal coating technique. For example, where the mandrel layer 102 is an oxide, a CVD process may be used. In another example, a metal mandrel layer 102 is deposited using ALD, PVD, CVD or the like to form a metal layer or silicide layer.

Figure 10:
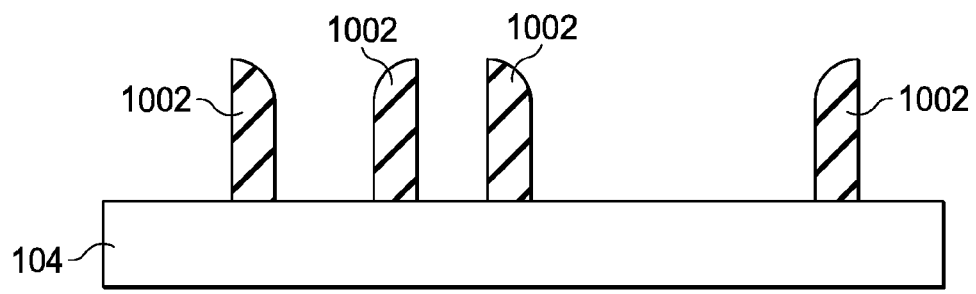

FIG. 10 is a cross-sectional view illustrating formation of the spacers 1002. The spacer layer 902 is anisotropically etched with a non-polymerizing etchant to remove the horizontal portions of the spacer layer 902, leaving the sidewall portions of the spacer layer 902. The mandrel layer 102 is then removed using selective etching, leaving the sidewalls of the spacer layer 902 as spacers 1002.

Figure 11:
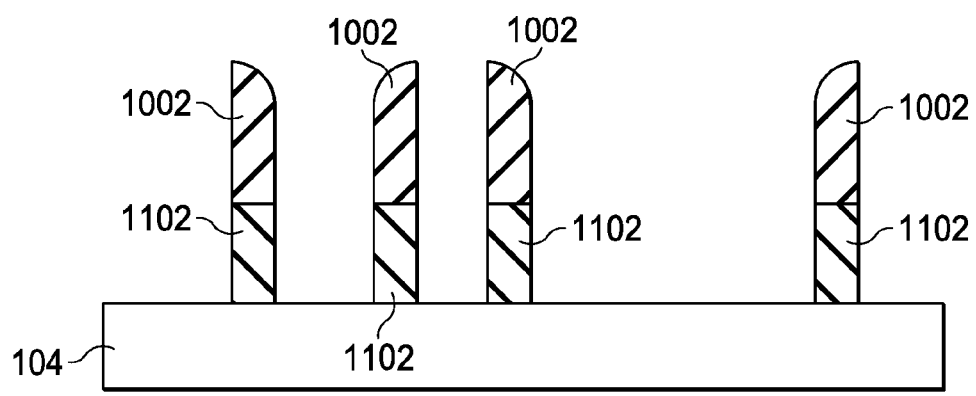

FIG. 11 is a cross-sectional view illustrating etching of the substrate 104 according to an embodiment. For example, the substrate 104 is anisotropically etched using the spacers 1002 as a mask, creating etched structures 1102 from the substrate 104 material. In an embodiment, the etched structures 1102 are, for example, fins for a FinFET, microelectrical mechanical (MEMs) device structures, or another structures. In another embodiment, the etched structures 1102 are the boundaries for structures formed in the recesses created by etching the substrate 104, such as shallow trench isolation structures. It should be understood that the presented disclosure is not limited to the end products described herein, as any suitable structure may be formed from the embodiments.

Figure 12:
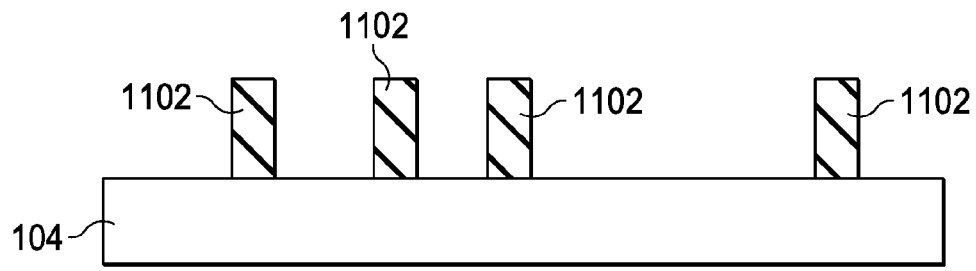

FIG. 12 is a cross-sectional view illustrating removal of the spacers 1002 according to an embodiment. In an embodiment the spacers 1002 are selectively etched to remove the spacers 1002 without modifying the substrate 104 and etched structures 1102.

Figure 16:
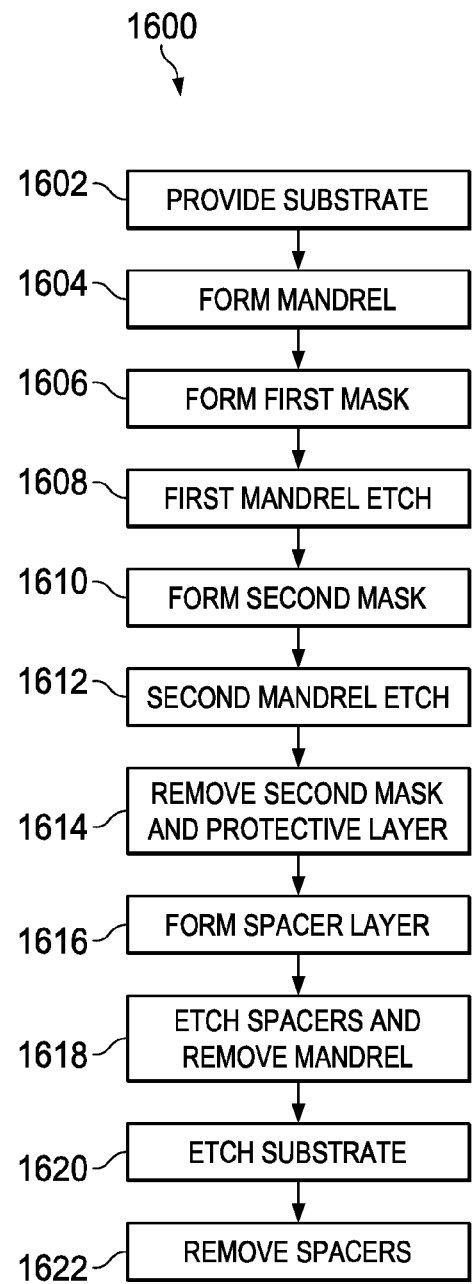
FIG. 16 is a flow diagram illustrating a method of forming spacers and patterning a substrate layer according to an embodiment.

FIG. 16 is a flow diagram illustrating a method for etching a substrate with a polymerizing etchant. A substrate is provided in block 1602 and a mandrel layer is formed on the substrate in block 1604. A first mask is formed on the mandrel layer in block 1606. The mandrel layer is etched with a first etch in block 1608 to create a first opening. A second mask is formed over the mandrel layer in block 1610, the first mask exposing at least portion of the first opening. A second mandrel layer etch is performed in block 1612 using a polymerizing etchant to create a protective layer in the first opening. The second mask and protective layer are removed in block 1614, and a spacer layer is formed in block 1616. The spacer layer is etched and the mandrel layer removed in block 1618. The substrate is etched in block 1620 to create etched structures in the substrate, and the spacers are removed in block 1622. Additional processing is subsequently performed to form one or more semiconductor devices using at least a portion of the etched structures.

Thus, according to an embodiment of the disclosure, a method of forming a structure comprises forming a mandrel layer over a substrate, etching the mandrel layer at least once with a polymerizing etchant, the polymerizing etchant forming a protective layer on an exposed portion of the substrate during the etching. The method further comprises forming one or more spacers on the sidewalls of the mandrel layer, and etching the substrate using the spacers as a mask. The method further comprises forming a first opening in the mandrel layer prior to the etching the mandrel layer at least once with the polymerizing etchant, the first opening exposing the substrate. The etching the mandrel layer at least once with the polymerizing etchant comprises forming a mask over the mandrel layer and having at least one mask opening over the first opening, the mask opening exposing the substrate through the first opening. In an embodiment, the mandrel layer is formed from silicon nitride. The polymerizing etchant comprises at least one of carbon tetraflouride, diflouromethane or a combination of tetraflouride and diflouromethane. The protective layer comprises at least one of $C_xH_yF_z$, $C_xH_y$, or combination thereof.

According to another embodiment, a method of forming a structure comprises forming a mandrel layer over a substrate, masking the mandrel layer with a first mask and performing a first etch on the mandrel layer, the first etch forming a first opening exposing a first portion of the substrate. The mandrel layer is masked with a second mask and a second etch is performed on the mandrel layer. The second etch forms a second opening exposing a second portion of the substrate, and also forms a protective layer on the first portion of the substrate and in the first opening.

According to another embodiment, a method of forming a structure comprises forming a mandrel layer over a substrate, performing a first etch on the mandrel layer, the first etch forming a first opening exposing a first portion of the substrate. A second etch is performed on the mandrel layer, the second etch forming a second opening exposing a second portion of the substrate and forming a protective layer on the first portion of the substrate and in the first opening. A spacer layer is formed over the mandrel layer, etched to form spacers, and the substrate is etched using the spacers as a mask. The surfaces of the first portion and second portion of the substrate are substantially coplanar after the second etch.

One general aspect disclosed herein includes a method including: depositing a mandrel layer on a substrate; forming a first patterned mask layer on the mandrel layer; etching a first opening in the mandrel layer, using the first patterned mask layer as an etch mask, the first opening exposing a portion of the substrate; removing the first patterned mask layer; forming a second patterned mask layer on the mandrel layer; etching a second opening in the mandrel layer using the second patterned mask layer as an etch mask and simultaneously forming a protective layer on the exposed portion of the substrate; and removing the second patterned mask layer.

In one aspect, embodiments disclosed herein may include a method, including: forming a mandrel layer having at least one opening therein exposing an underlying surface; etching the mandrel layer and simultaneously forming a protective layer on the underlying surface; and forming spacers on respective sidewalls of the mandrel layer.

In another aspect, embodiments disclosed herein may include a method of forming a structure, including: depositing a mandrel layer on a substrate. The method also includes etching the mandrel layer at least once while simultaneously with the etching forming a protective layer on an exposed portion of the substrate. The method also includes forming spacers on respective sidewalls of the mandrel layer. The method also includes removing the mandrel layer.

In yet another aspect, embodiments disclosed herein may include a method including depositing a mandrel layer on a substrate. A first etching process is performed on the mandrel layer, the first etching process exposing a portion of the substrate. A second etching process is performed on the mandrel layer using a polymerizing etchant to form a protective polymer layer on the exposed portion of the substrate. The substrate and remaining portions of the mandrel layer are coated with a spacer layer. A third etching process is performed to remove horizontal portions of the spacer layer, and a fourth etching process is performed to remove the mandrel layer.

Another general aspect disclosed herein includes a method including forming a mandrel layer on a substrate, the mandrel layer including an opening exposing a surface of the substrate. The mandrel layer is etched using a polymerizing etchant, wherein the etching forms a protective layer on the exposed surface of the substrate. Spacers are formed on sidewalls of the mandrel layer, and the mandrel layer is removed.

Another general aspect disclosed herein includes a method including forming a mandrel on a substrate. A first etching process is performed on the mandrel, the first etching process forming an opening in the mandrel, wherein a bottom surface of the opening exposes the substrate. A second etching process is performed on the mandrel, the second etching process forming a protective layer on the bottom surface of the opening. The protective layer is removed and spacers are formed on sidewalls of the mandrel.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   depositing a mandrel layer on a substrate;
   performing a first etching process on the mandrel layer, the first etching process exposing a portion of the substrate;
   performing a second etching process on the mandrel layer to form a protective polymer layer on the exposed portion of the substrate;
   coating the substrate and remaining portions of the mandrel layer with a spacer layer;
   performing a third etching process to remove horizontal portions of the spacer layer; and
   performing a fourth etching process to remove the mandrel layer.

2. The method of claim 1, wherein a polymerizing etchant is selected from the group consisting of $CF_4$, diflouromethane ($CH_2F_2$), octaflourocyclobutane ($C_4F_8$), hexafluorobutadiene ($C_4F_6$), flouroform ($CHF_3$), and combinations thereof.

3. The method of claim 1, wherein performing the first etching process comprises performing a dry plasma etch process.

4. The method of claim 1, wherein performing the first etching process on the mandrel layer comprises:
   depositing a first mask over the mandrel layer;
   patterning the first mask;
   etching a first opening in the mandrel layer using the patterned first mask as an etch mask; and
   removing the patterned first mask.

5. The method of claim 4, wherein performing the second etching process on the mandrel layer comprises:
   depositing a second mask over the mandrel layer;
   forming a second opening in the second mask, wherein the second opening is over the first opening in the mandrel layer; and
   etching the mandrel layer with a polymerizing etchant to form the protective polymer layer on the exposed portion of the substrate.

6. The method of claim 5, wherein the second mask extends into the first opening.

7. The method of claim 5, further comprising removing the second mask and the protective polymer layer before coating the substrate and the remaining portions of the mandrel layer with the spacer layer.

8. The method of claim 1, wherein performing the third etching process to remove the horizontal portions of the spacer layer comprises anisotropically etching the spacer layer with a non-polymerizing etchant.

9. The method of claim 1, further comprising performing a fifth etching process on the substrate using remaining portions of the spacer layer as a mask, the fifth etching process forming etched structures.

10. A method comprising:
    forming a mandrel layer on a substrate, the mandrel layer comprising an opening exposing a surface of the substrate;
    etching the mandrel layer using a polymerizing etchant, wherein the etching forms a protective layer on the exposed surface of the substrate;
    forming spacers on sidewalls of the mandrel layer; and
    removing the mandrel layer.

11. The method of claim 10, wherein removing the mandrel layer comprises selectively etching the mandrel layer such that the spacers remain intact.

12. The method of claim 11, further comprising, after removing the mandrel layer, etching an upper portion of the substrate using the spacers as an etch mask to form etched structures underlying the spacers.

13. The method of claim 10, wherein forming the spacers on the sidewalls of the mandrel layer comprises:
    conformally forming a spacer layer on the substrate and the mandrel layer; and
    etching horizontal portions of the spacer layer.

14. The method of claim 10, further comprising removing the protective layer before forming the spacers on the sidewalls of the mandrel layer.

15. A method comprising:
    forming a mandrel on a substrate;
    performing a first etching process on the mandrel, the first etching process forming an opening in the mandrel, wherein a bottom surface of the opening exposes the substrate;
    performing a second etching process on the mandrel, the second etching process forming a protective layer on the bottom surface of the opening;
    removing the protective layer; and
    forming spacers on sidewalls of the mandrel.

16. The method of claim 15, wherein performing the second etching process comprises etching the mandrel using a polymerizing etchant, and wherein the protective layer is a polymer comprising $C_xH_y$ or $C_xH_yF_z$.

17. The method of claim 16, wherein the polymerizing etchant is selected from the group consisting of $CF_4$, diflouromethane ($CH_2F_2$), octaflourocyclobutane ($C_4F_8$), hexafluorobutadiene ($C_4F_6$), flouroform ($CHF_3$), and combinations thereof.

18. The method of claim 15, wherein performing the first etching process comprises using a first mask, and wherein performing the second etching process comprises using a second mask.

19. The method of claim 18, wherein an opening in the second mask overlaps the opening in the mandrel.

20. The method of claim 15, further comprising removing the mandrel, wherein after removing the mandrel, the spacers remain on the substrate.

* * * * *